(12) United States Patent
Choi et al.

(10) Patent No.: US 8,778,776 B2
(45) Date of Patent: Jul. 15, 2014

(54) METHODS OF FORMING A SEMICONDUCTOR PACKAGE USING A SEED LAYER AND SEMICONDUCTOR PACKAGES FORMED USING THE SAME

(75) Inventors: Ju-il Choi, Suwon-si (KR); Kyu-Ha Lee, Yongin-si (KR); Jae-hyun Phee, Incheon (KR); Jung-Hwan Kim, Bucheon-si (KR); Tae Hong Min, Gumi-si (KR)

(73) Assignee: Samsung Electronics Co., Ltd. (KR)

( * ) Notice: Subject to any disclaimer, the term of this patent is extended or adjusted under 35 U.S.C. 154(b) by 248 days.

(21) Appl. No.: 13/187,760

(22) Filed: Jul. 21, 2011

(65) Prior Publication Data

US 2012/0083097 A1    Apr. 5, 2012

(30) Foreign Application Priority Data

Oct. 1, 2010   (KR) ................. 10-2010-0096065

(51) Int. Cl.
*H01L 21/78* (2006.01)

(52) U.S. Cl.
CPC ..................................... *H01L 21/78* (2013.01)
USPC .......................................................... 438/458

(58) Field of Classification Search
None
See application file for complete search history.

(56) References Cited

U.S. PATENT DOCUMENTS

| 7,176,575 B2 | 2/2007 | Mosley et al. |
| 2004/0217455 A1 | 11/2004 | Shiono et al. |
| 2006/0057836 A1* | 3/2006 | Nagarajan et al. ............ 438/622 |

FOREIGN PATENT DOCUMENTS

| JP | 11-214445 | 8/1999 |
| KR | 1020060037658 A | 5/2006 |

* cited by examiner

*Primary Examiner* — Fernando L Toledo
*Assistant Examiner* — Valerie N Newton
(74) *Attorney, Agent, or Firm* — Myers Bigel Sibley & Sajovec, P.A.

(57) ABSTRACT

Provided is a method of forming a semiconductor package including providing a substrate having a first side and an opposite second side and providing a wafer having a plurality of semiconductor chips, each of the semiconductor chips having a conductive pad, wherein at least one of the substrate and the wafer includes a seed pattern. The first side of the substrate is bonded to the wafer with the conductive pad positioned adjacent to the first side of the substrate and the seed pattern positioned between the conductive pad and the first side of the substrate. A through hole is then formed penetrating the substrate from the second side of the substrate to expose the seed pattern. A through electrode is formed in the through hole using the seed pattern as a seed. Corresponding devices are also provided.

16 Claims, 19 Drawing Sheets

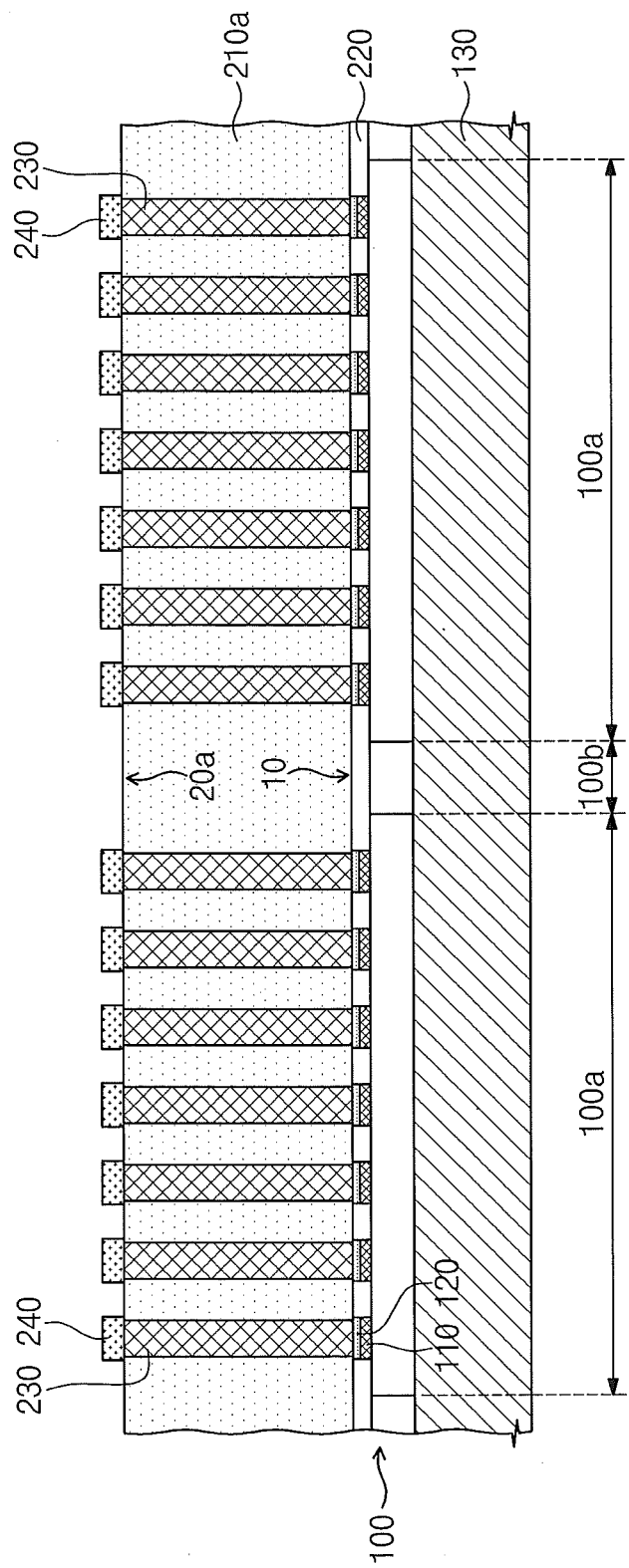

METHODS OF FORMING A SEMICONDUCTOR PACKAGE USING A SEED LAYER AND SEMICONDUCTOR PACKAGES FORMED USING THE SAME

CROSS-REFERENCE TO RELATED APPLICATIONS

This U.S. non-provisional patent application claims priority under 35 U.S.C. §119 of Korean Patent Application No. 10-2010-0096065, filed on Oct. 1, 2010, the entire contents of which are hereby incorporated by reference.

BACKGROUND

The embodiments of the present inventive concept herein relate to a method of forming a semiconductor package and a semiconductor package formed using the same.

Demands on light, miniaturized, high-speed, multi-functional, and high performance, and highly reliable products for use in electronic products such as mobile phones and portable computers continue to increase. As one solution for satisfying these demands, a method of applying an interposer to a semiconductor package has been proposed. The interposer is interposed between a plurality of semiconductor chips in a semiconductor package so that the plurality of semiconductor chips are vertically stacked to form a three-dimensional layer stacked package. Additionally, the interposer is interposed between a semiconductor chip and a circuit substrate in a formation process of a semiconductor module so that a rewiring function and a function for preventing defective connections between the semiconductor chip and the circuit substrate may be provided. Research continues to try to improve reliability and electrical characteristics of semiconductor packages including an interposer.

SUMMARY

Some embodiments provide a method of forming a semiconductor package including providing a substrate having a first side and an opposite second side and providing a wafer having a plurality of semiconductor chips. Each of the semiconductor chips has a conductive pad and at least one of the substrate and the wafer includes a seed pattern. The first side of the substrate is bonded to the wafer with the conductive pad positioned adjacent to the first side of the substrate. The seed pattern is positioned between the conductive pad and the first side of the substrate. A through hole is then formed penetrating the substrate from the second side of the substrate to expose the seed pattern. A through electrode is formed in the through hole using the seed pattern as a seed.

In other embodiments, providing the wafer and/or providing the substrate includes forming the seed layer. Providing the wafer may include forming the seed pattern on the conductive pad of the wafer and bonding the first side of the substrate may include contacting the first side of the substrate with the seed pattern of the wafer. Providing the substrate may include forming an adhesive mold layer on the first side of the substrate and patterning the mold layer to define an opening. Bonding the first side of the substrate may include aligning the wafer with the substrate to position the contact pad and the seed layer in the opening in the mold layer and then bonding the wafer to the first side of the substrate with the adhesive mold layer.

In further embodiments, providing the substrate includes forming the seed pattern on the first side of the substrate and bonding the first side of the substrate includes contacting the conductive pad of the wafer with the seed pattern of the substrate. Providing the substrate may includes forming an adhesive mold layer on the first side of the substrate, patterning the mold layer to define an opening and forming the seed pattern in the opening in the mold layer. Bonding the first side of the substrate may include aligning the wafer with the substrate to position the contact pad in the opening in the mold layer and then bonding the wafer to the first side of the substrate with the adhesive mold layer.

In other embodiments, providing the substrate includes forming the seed pattern on the first side of the substrate and forming a bonding pad on the seed pattern. Bonding the first side of the substrate includes contacting the conductive pad of the wafer with the bonding pad of the substrate. Providing the substrate may include forming an adhesive mold layer on the first side of the substrate, patterning the mold layer to define an opening, forming the seed pattern in the opening in the mold layer and forming the bonding pad on the seed pattern in the opening in the mold layer. Bonding the first side of the substrate may include aligning the wafer with the substrate to position the contact pad in the opening in the mold layer and then bonding the wafer to the first side of the substrate with the adhesive mold layer.

In further embodiments, forming the seed pattern comprise forming the seed pattern using an electroplating process or an electroless plating process. Forming the through hole may be preceded by forming a protective layer on the first side of the substrate that covers the wafer. Forming the through electrode may comprise forming the through electrode using an electroless plating process, an electro plating process, or a metal growth process. Forming the through electrode may comprise forming the through electrode using a metal growth process.

In yet other embodiments, forming the through electrode is followed by forming a wiring on the second side of the substrate that is electrically connected to the through electrode and forming a bump on the wiring.

In further embodiments, the wafer includes a scribe lane between adjacent ones of the plurality of semiconductor chips and forming the through electrode is followed by separating the plurality of semiconductor chips by cutting the substrate and the wafer along the scribe lane.

In other embodiments, the conductive pad and the seed pattern are a plurality of conductive pads and seed patterns associated with each of the plurality of semiconductor chips. Bonding the first side of the substrate includes bonding the first side with respective ones of the conductive pads positioned with corresponding ones of the seed patterns positioned between the conductive pads and the first side of the substrate. Forming the through hole and forming the through electrode comprises forming a through hole and forming a through electrode associated with each of the conductive pads and the corresponding ones of the seed patterns. The seed patterns may be copper (Cu), silver (Ag) and/or nickel (Ni).

In other embodiments, the substrate comprises glass and forming the through electrode comprises forming the through electrode directly contacting the substrate in the through hole.

In yet further embodiments, a semiconductor package includes a substrate having a first side and an opposite second side and a semiconductor chip on the first side of the substrate. The semiconductor chip includes a conductive pad adjacent to the first side of the substrate. A through electrode penetrates the substrate and connects electrically to the conductive pad. A seed pattern is disposed between the conductive pad and the through electrode and has a first side contacting the conductive pad and a second side contacting the through electrode.

In other embodiments, the substrate comprises glass and the through electrode directly contacts the substrate in the through hole. The semiconductor package further comprises a protective layer on the first side of the substrate that covers the semiconductor chip. The package may further include a bonding pad between the seed pattern and the conductive pad and the seed pattern, the bonding pad, and the conductive pad may be electrically connected. The seed pattern may be at least one of Cu, Ag, or Ni.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIGS. 1 through 8 are sectional views illustrating a method of forming a semiconductor package according to embodiments of the inventive concept;

DETAILED DESCRIPTION OF THE EMBODIMENTS

Figure 1:
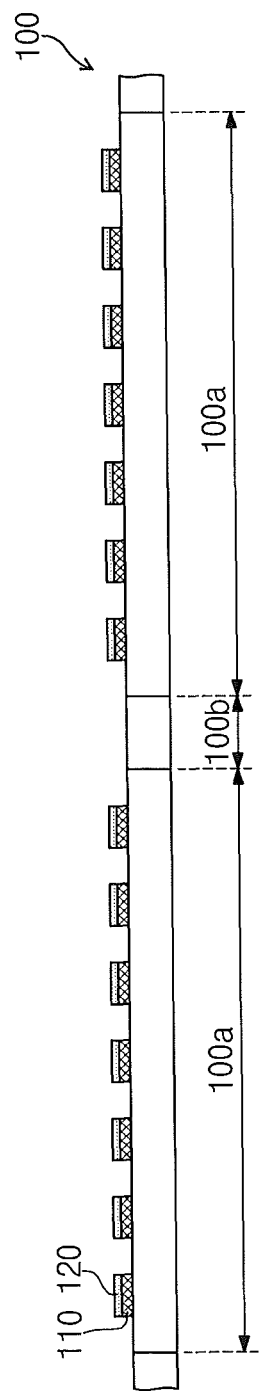

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

The terminology used herein is for the purpose of describing particular embodiments only and is not intended to be limiting of the invention. As used herein, the singular foams "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention. An embodiment described and exemplified herein includes a complementary embodiment thereof. Accordingly, in some embodiments, well-known processes, well-known device structures, and well-known techniques will not be described in detail to avoid ambiguous interpretation of the inventive concept. Like reference numerals refer to like elements throughout.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

First Embodiments

Hereinafter, a method of forming a semiconductor package according to some embodiments will be described with reference to the cross-sectional views of FIGS. 1 through 8. Referring to FIG. 1, a wafer 100 including a plurality (two shown) of semiconductor chips 100a may be provided. The wafer 100 may further include a scribe lane 100b between the semiconductor chips 100a. The wafer 100 may include a semiconductor material. For example, the wafer 100 may include at least one of silicon or germanium.

The semiconductor chips 100a may include a conductive pad 110, shown as a plurality of conductive pads 110 in a pattern in FIG. 1. The conductive pad 110 may be formed, for example, using an electroless plating process and/or an electro plating process. The conductive pad 110 may include metal. For example, the conductive pad 110 may include at least one of aluminum (Al), copper (Cu), nickel (Ni), or gold (Au).

A seed pattern 120 may be formed on the conductive pad 110. The seed pattern 120 may be formed, for example, through an electroless plating process and/or an electro plating process. The seed pattern 120 may include metal. For example, the seed pattern 120 may include at least one of Cu, Ni, or Au.

In some embodiments, the conductive pad 110 and the seed pattern 120 may be substantially simultaneously formed using a patterning process. In this case, the conductive pad 110 and the seed pattern 120 may be formed by sequentially stacking a conductive layer and a seed layer on the semiconductor chips 100a and then patterning the conductive layer and the seed layer to have a pattern as seen in FIG. 1.

Figure 2:
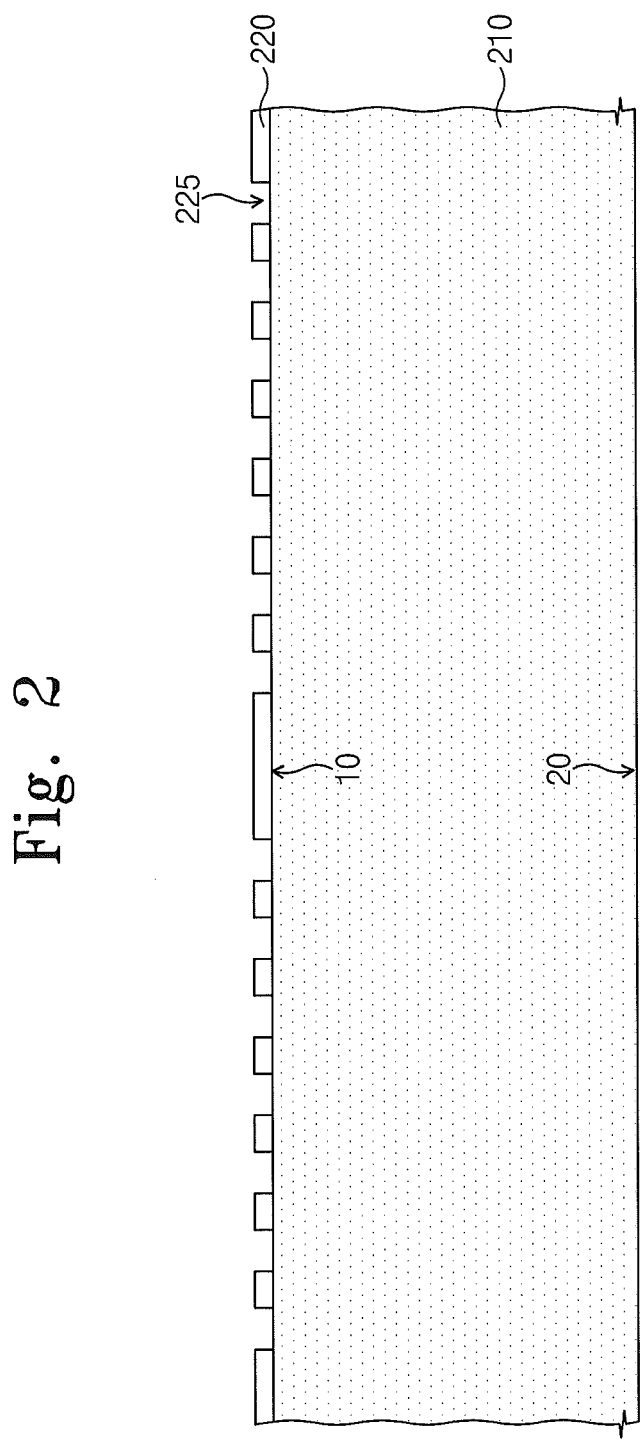

Referring to FIG. 2, a substrate 210 has a first side 10 and a second side 20, opposite the first side 10. A mold layer 220 is shown formed on the first side 10 of the substrate 210. The substrate 210 may include silicon or glass. According to some embodiments, the substrate 210 includes an interposer as will be further described.

The mold layer 220 may include an opening 225, shown as a plurality of openings 225 in a pattern in FIG. 2, exposing the first side 10 of the substrate 210. The opening 225 may be aligned to a through electrode 230 described later with reference to FIG. 7. It will be understood that while the description herein is provided in reference to the singular for features (with reference to both the wafer 100 and the substrate 210), each of the features repeated in the pattern illustrated in the figures may be formed in substantially the same manner, may be formed at the same time and may correspond to different associated electrical regions/features of the product.

The mold layer 220 may include an adhesive material. The mold layer 220 may be formed by forming an adhesive layer on the first side 10 of the substrate and then patterning the adhesive layer. In some embodiments, the mold layer 220 may be formed through a printing method (e.g., roll to roll print process or an imprint process).

Figure 3:
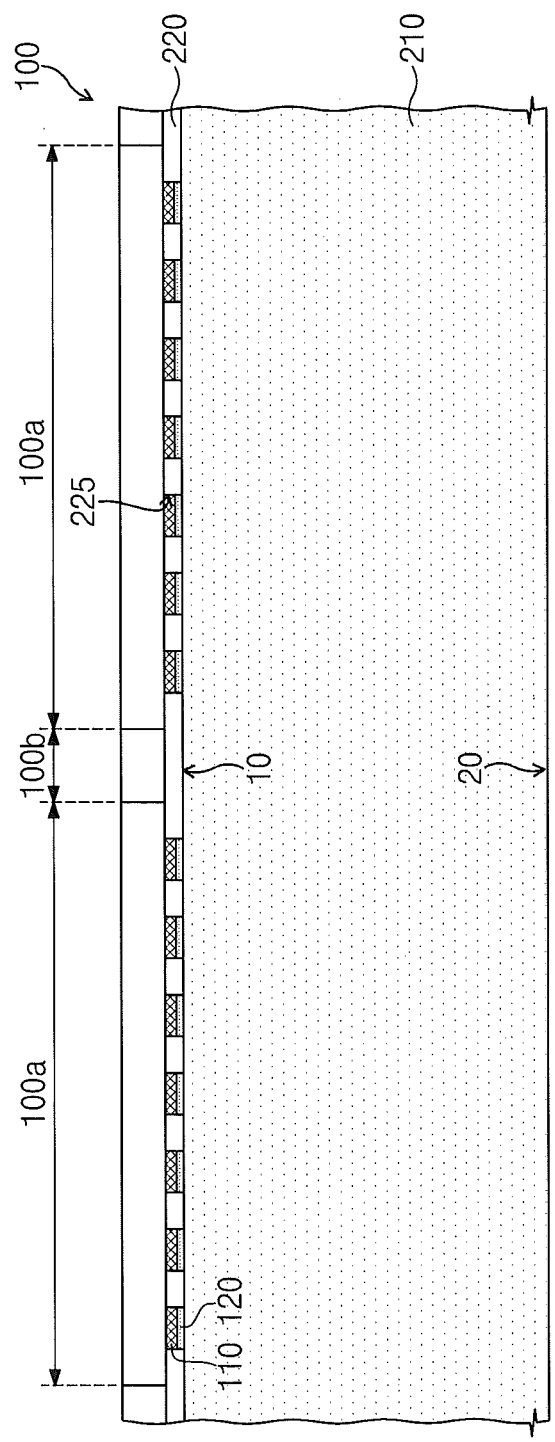

Referring to FIG. 3, the wafer 100 is shown disposed on the mold layer 220 and the substrate 210 and the wafer 100 are bonded to each other. The wafer 100 may be disposed (positioned/aligned) to allow the conductive pad 110 and the seed pattern 120 to be adjacent to the first side 10 of the substrate 210 (i.e., aligned with corresponding ones of the openings 225). Thus the conductive pad 110 and the seed pattern 120 may be aligned to pass through the inside of the opening 225 of the mold layer 220. At this point, the seed pattern 120 may contact the first side 10 of the substrate 210 exposed by the opening 225. According to some embodiments, the bottom of the opening 225 may be defined by (correspond to) the first side 10 of the substrate 210, allowing the seed pattern 120 to directly contact the first side 10. As the mold layer 220 includes an adhesive material, the wafer 100 and the substrate 210 may be bonded to each other using the adhesive material.

Figure 4:
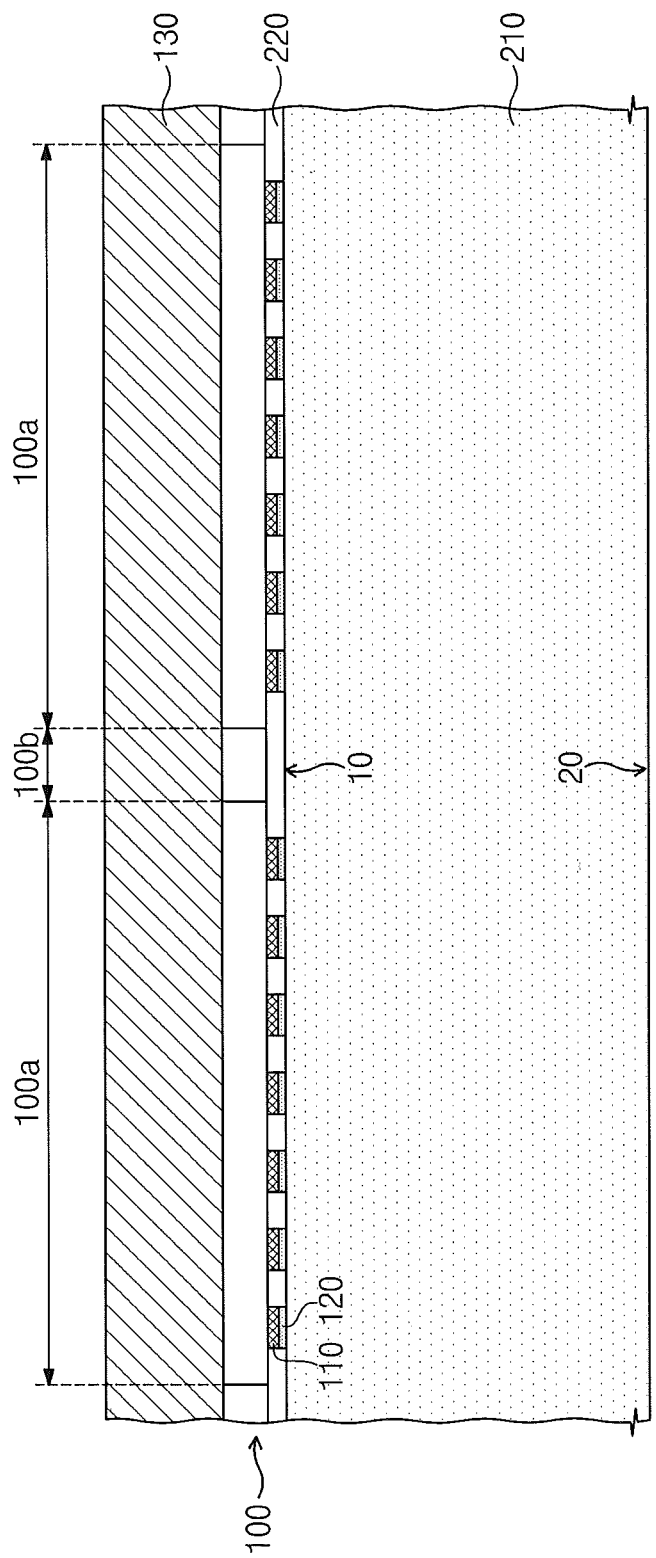

Referring to FIG. 4, a protective layer 130 may be formed on the first side 10 of the substrate 210 to cover the wafer 100. The protective layer 130 may include an insulation material. For example, the protective layer 130 may include at least one of glass or a high molecular compound. The protective layer 130 may minimize the damage of the wafer 100 caused by following processes.

Figure 5:
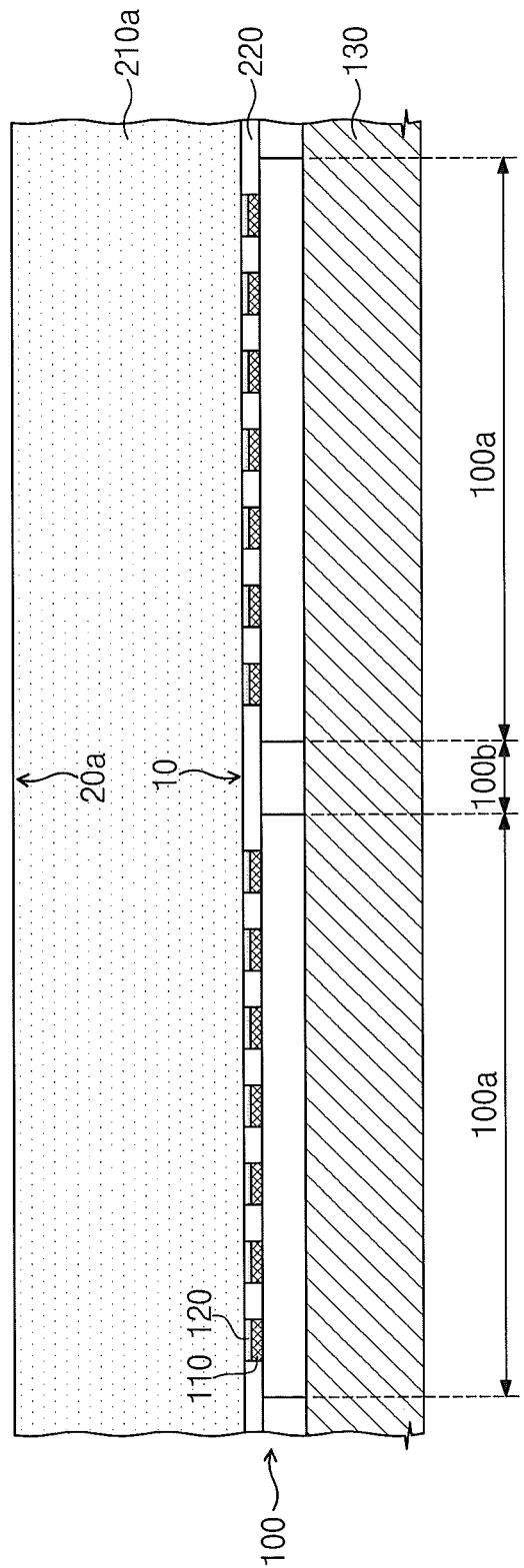

Referring to FIG. 5, a thickness of the substrate 210 may be reduced by, for example, etching the second side 20 of the substrate 210. The reducing of the thickness of the substrate 210 may be performed through at least one of a dry etch process, a wet etch process, or a chemical mechanical polishing process to result in an etched substrate 210a. According to some embodiments, the reducing of the thickness of the substrate 210 may be omitted, particularly where the thickness of the substrate 210 may be sufficiently thin to directly form a through electrode without further thinning of the substrate 210.

Figure 6:
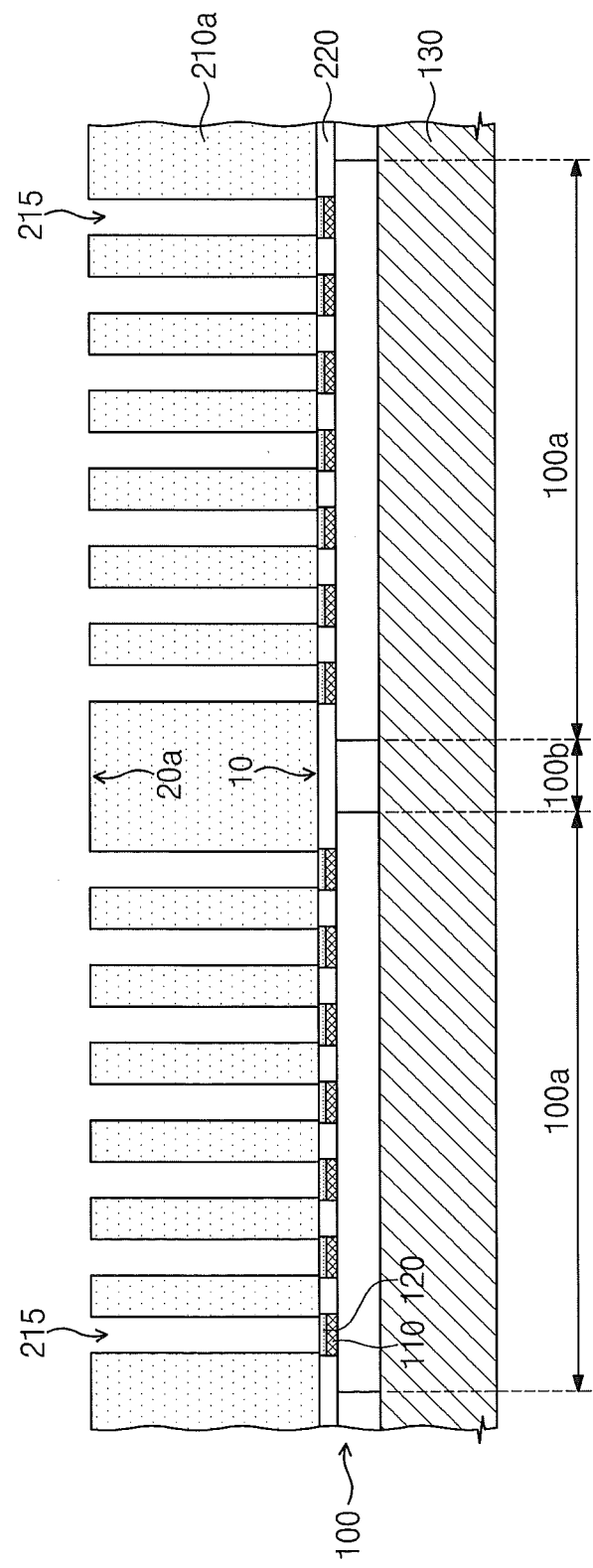

Referring to FIG. 6, a through hole 215 penetrating from an etched second side 20a to the etched substrate 210a may be formed in the etched substrate 210a. The through hole 215 may be formed, for example, by forming a mask pattern on the etched second side 20a and then performing a dry etch process on the etched substrate 210a using the mask pattern as an etch mask. A bottom of the through hole 215 may expose the seed pattern 120.

Figure 7:
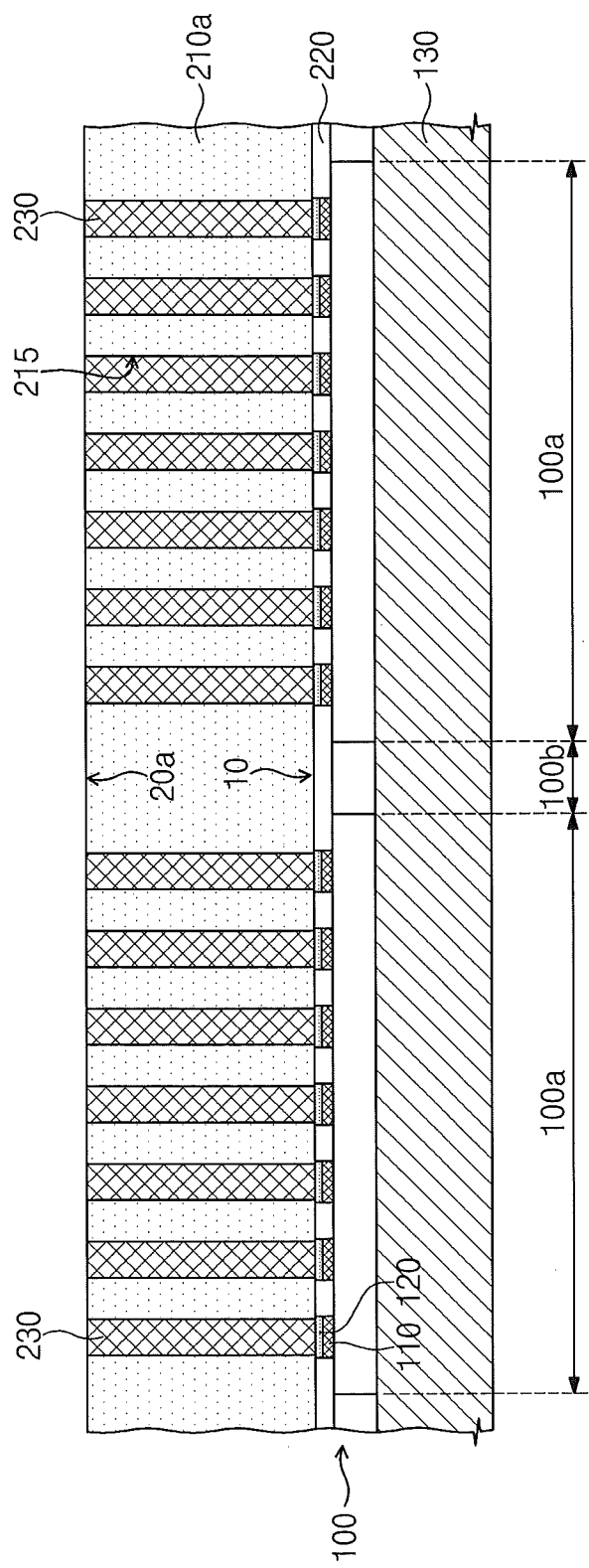

Referring to FIG. 7, a through electrode 230 may be formed in the through hole 215. The through electrode 230 may be formed through an electroplating process, an electroless plating process, or a metal growth process, which use the seed pattern 120 as a seed. The metal growth process may be performed by adsorbing metal ions or metal particles on the seed pattern 120. The through electrode 230 may include metal. For example, the through electrode 230 may include Cu. A height of the through electrode 230 may be identical to or greater than a thickness of the etched substrate 210a. As the through electrode 230 is formed using the exposed seed pattern 120, a process for forming a seed layer in the through hole 215 to form the through electrode 230 need not be additionally performed. Accordingly, manufacturing processes may be simplified so that productivity may be improved and manufacturing cost may be reduced.

Although not shown in the drawings, when the substrate 210 includes silicon, before the forming of the through electrode 210, a spacer may be interposed between a sidewall of the through hole 215 and the through electrode 230. The spacer may include an insulation material. For example, the spacer may include at least one of a silicon oxide, a silicon oxide nitride, or a silicon nitride. If there is no spacer, a defect where respective ones of adjacent through electrodes are electrically connected to each other through the silicon in the substrate may occur.

When the substrate 210 includes glass, the through electrode may be directly formed in the through hole 215 without a spacer with reduced risk of such defects. In this case, since the substrate 210 has insulation, adjacent through electrodes may be ensured to remain electrically insulated from each other. In this case, since a spacer does not need to be formed on the sidewall of the through hole 215, a width of the through hole 215 for forming the through electrode 230 may be reduced, so that a process margin may be obtained.

Referring to FIG. 8, a wiring 240 may be formed on the etched second side 20a of the etched substrate 210a. The wiring 240 may electrically contact the through electrode 230. The wiring 240 may include metal. For example, the wiring 240 may include at least one of copper or aluminum. The semiconductor chips 100a may include features conductively coupled through the wiring 240.

A bump may be further formed on the wiring 240. The bump may include a solder ball. The bump may include metal. For example, the bump may include at least one of copper or nickel.

The plurality of semiconductor chips 100a may be separated by cutting along the scribe lane 100b through the protective layer 130, and the etched substrate 210a and the wafer 100. A plurality of semiconductor packages according to some embodiments may be formed by the cutting process.

Figure 9A:
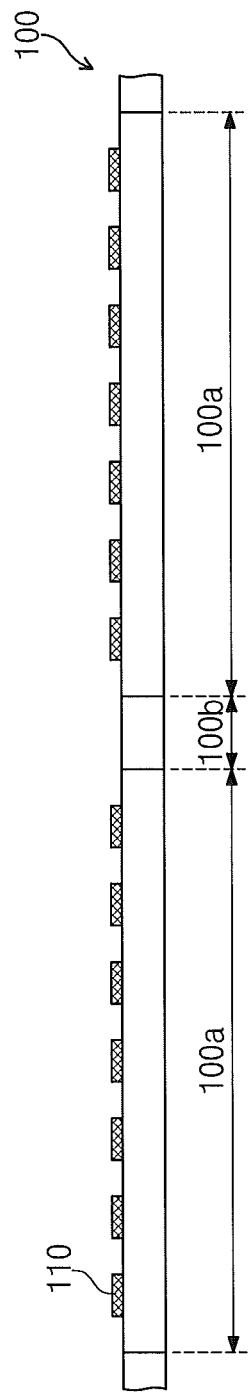
FIGS. 9A and 9B are sectional views illustrating a formation process of a seed pattern according to further embodiments of the inventive concept.
Figure 9B:
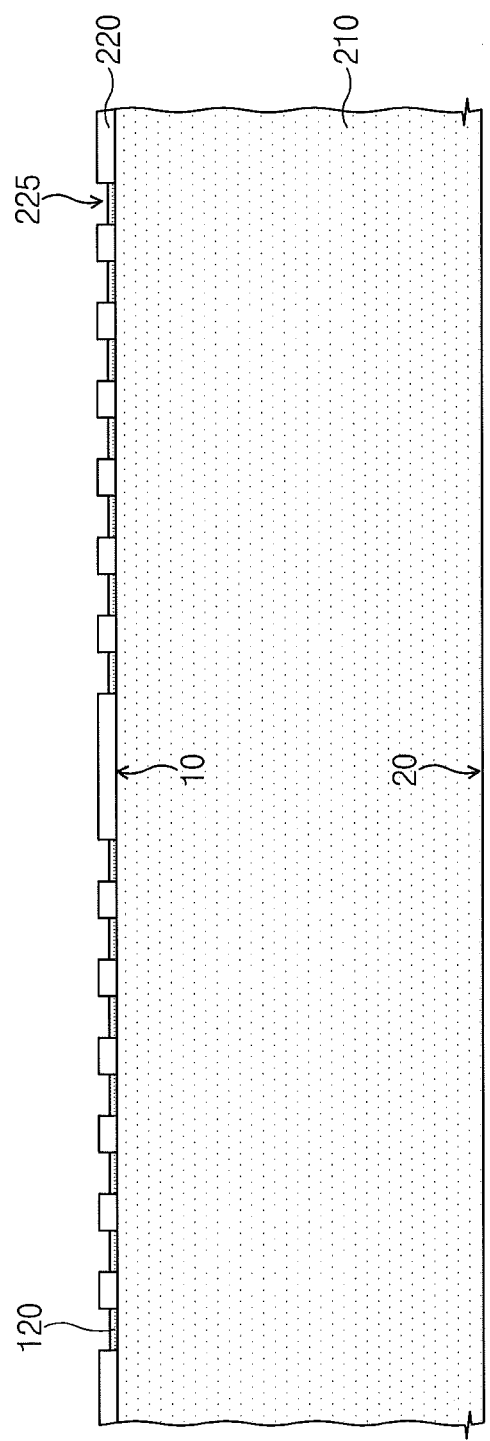

FIGS. 9A and 9B are sectional views illustrating a modification of a formation process of a seed pattern according to some embodiments Referring to FIG. 9A, the wafer 100 having the plurality of semiconductor chips 100a may be provided. Each of the semiconductor chips 100a may include a conductive pad 110. The conductive pad 110 may be formed through an electroless plating process or an electro plating process. The conductive pad 110 may include the same material as that in the above embodiments.

Referring to FIG. 9B, like the above, a substrate 210 may have the first side 10 and the opposite second side 20. The mold layer 220 including the opening 225 may be formed on the first side 10 of the substrate 210. The opening may expose the top side 10 of the substrate 210. The mold layer 220 may include an adhesive material. The mold layer 220 may be formed using the same method as the above embodiments.

A seed pattern 120 may be formed in the opening 225. The seed pattern 120 may be formed on the first side 10 of the substrate 210 exposed by the opening 225 through an electroless plating or electrode plating process. The seed pattern 120 may include the same material as that of the above embodiments.

As shown in FIG. 3, the wafer 100 may be bonded to the first side 10 of the substrate 210 to contact the conductive pad 110 with the seed pattern 120. The conductive pattern 110 may be aligned to the inside of the opening 225 of the molding layer 220. The first side of the seed pattern 120 may contact the conductive pattern 110 and the opposite second side may contact the substrate, acting as an interposer substrate. As described in the above embodiments, as the mold layer 220 includes an adhesive material, the wafer 100 may be bonded with the substrate 210.

According to some embodiments, after the bonding the substrate 210 with the wafer 100, the through electrode 230 may be formed. If a through electrode is formed first on an interposer substrate and a wafer is bonded to the interposer substrate, due to misalignment between the conductive pad of the wafer and the through electrode, a defect may occur. Moreover, in order to form the through electrode, a hole is formed in the interposer substrate and then, a process for forming a seed layer on a bottom of the hole may be additionally performed. However, according to some embodiments, defects due to misalignment between the through electrode and the conductive pad of the wafer may be minimized and manufacturing processes may be simplified so that productivity may be improved.

Figure 10:
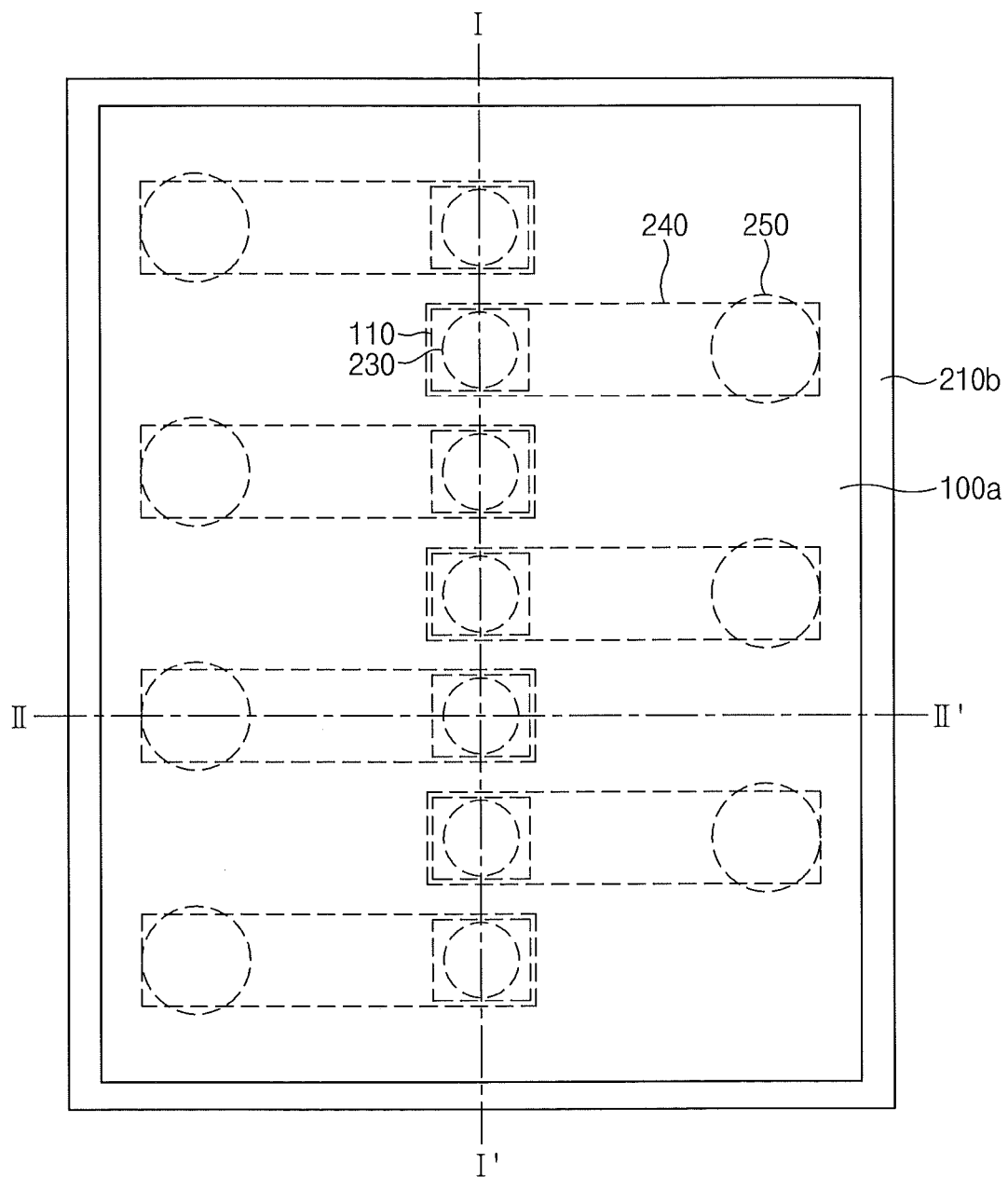
FIG. 10 is a plan view illustrating a semiconductor package according to some embodiments of the inventive concept.
Figure 11A:
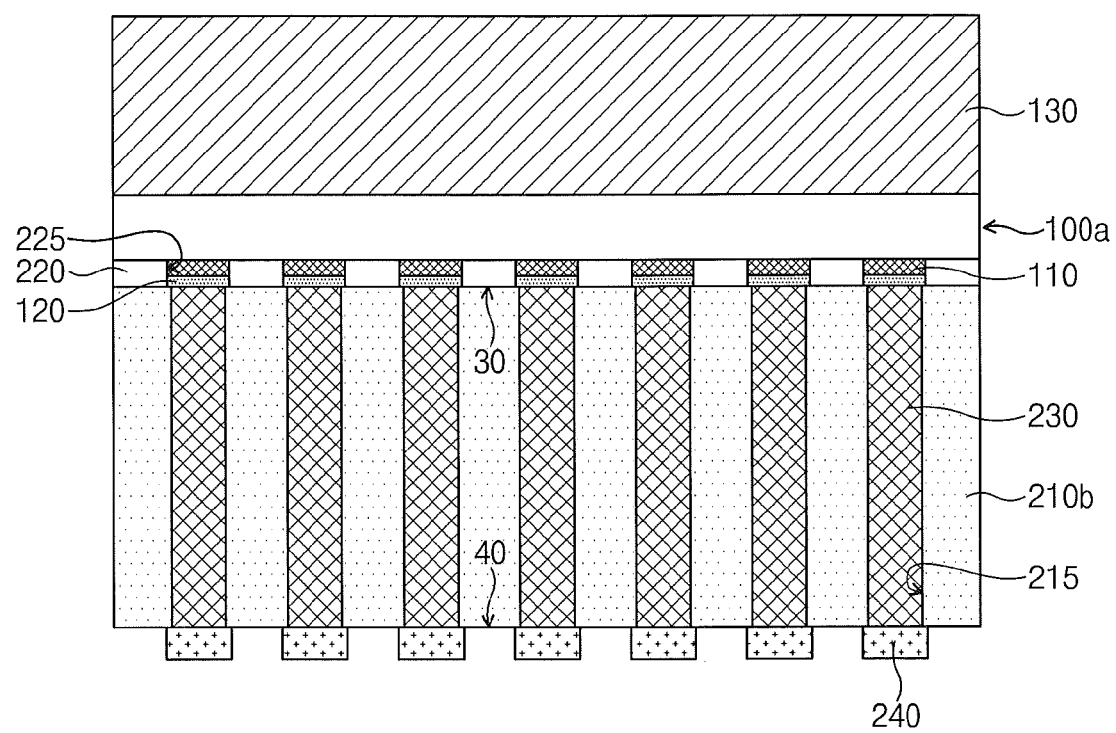
FIGS. 11A and 11B are sectional views illustrating a semiconductor package according to further embodiments of the inventive concept.
Figure 11B:
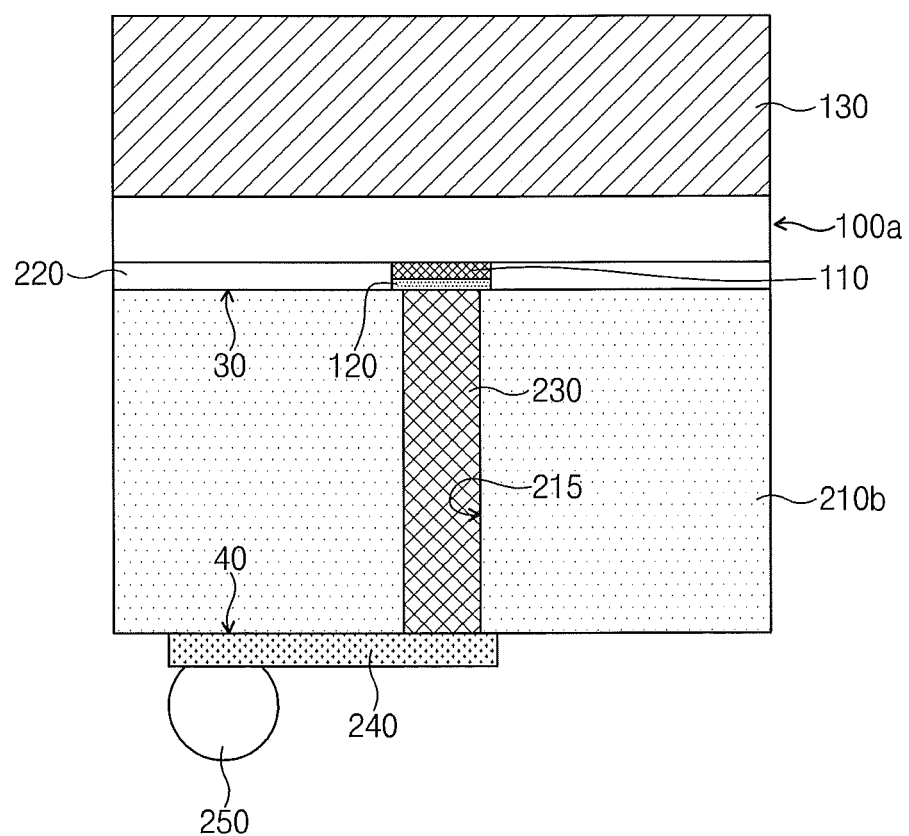

Hereinafter, a semiconductor package according to some embodiments will be described. FIG. 10 is a plan view illustrating a semiconductor package according to some embodiments. FIG. 11A is a sectional view taken along the line I-I' of FIG. 10. FIG. 11B is a sectional view taken along the line II-II'.

Referring to FIGS. 10 and 11A, a substrate 210b has a first side 30 and an opposite second side 40. The substrate 210b may include at least one of silicon or glass. According to some embodiments, the substrate 210b may include an interposer. When the substrate 210 has an interposer, the substrate 210b may be disposed between the semiconductor chip 100 and a circuit substrate in a semiconductor module using a semiconductor package according to some embodiments.

A through electrode 230 penetrating the substrate 210b may be disposed in the substrate 210b. The through electrode 230 may be formed by forming a through hole penetrating the substrate 210b in the substrate 210b and filling the through hole 215 with a conductive material. The conductive material may include metal. For example, the conductive material may include at least one of copper or aluminum. In some embodiments, where the substrate 210b is glass, the through electrode 230 may directly contact a sidewall of the through hole 215. In this case, interposing a spacer between the sidewall of the through hole 215 and the through electrode 230 may be omitted. Accordingly, a desired process margin for the through electrode 230 may be obtained.

In some embodiments where the substrate 210b is silicon, a spacer may be interposed between the through the electrode 230 and the sidewall of the through hole 215. The spacer may include an insulation material. For example, the spacer may include at least one of a silicon oxide layer, a silicon nitride layer, or a silicon oxide nitride layer. The spacer may limit or even prevent respective adjacent ones of the through electrodes from being electrically connected to each other through the substrate.

The mold layer 220 including the opening 225 may be disposed on the first side 30 of the substrate 210b. The opening 225 may be aligned to the through electrode 230. The mold layer 220 may include an adhesive material.

A semiconductor chip 100a may be disposed on the mold layer 220. The semiconductor chip 100a may include a conductive pad 110. The conductive pad 110 may include metal. For example, the conductive pad 110 may include at least one of Al, Cu, Ni, or Au.

The semiconductor chip 100a may be disposed to allow the conductive pad 110 to be adjacent to the through electrode 230 of the substrate 210b. The conductive pad 110 may be disposed in the opening 225 of the mold layer 220 so that it may be aligned to the through electrode 230.

A seed pattern 120 may be interposed between the conductive pad 110 and the through electrode 230. The seed pattern 120 may include a first side contacting the conductive pad 110 and a second side contacting the through electrode 230. The seed pattern 120 may be disposed in the opening 225 of the mold layer 220. Accordingly, the seed pattern 120 and the conductive pattern 110 may be sequentially stacked in the opening 225. The seed pattern 120 may include metal. The seed pattern 120 may include at least one of Ni, Au, or Cu. The conductive pad 110 may electrically contact the through electrode 230 through the seed pattern 120.

A protective layer 130a may be disposed on the semiconductor chip 100a on a side thereof opposite the side coupled to the substrate 210b. The protective layer 130a may include an insulation material. For example, the protective layer 130a may include at least one of glass or a high molecular compound.

As shown in FIGS. 10 and 11B, a wiring 240 and a bump 250 may be further disposed on the second side 40 of the substrate 210b. The wiring 240 may electrically contact the through electrode 230. Accordingly, a circuit of the semiconductor chip 100a may be rewired by the wiring 240. The bump 250 may be disposed on the wiring 240 to electrically contact the wiring 240. The bump 250 may include a solder ball. The bump 250 may connect a circuit substrate for forming a semiconductor module with a semiconductor package.

Second Embodiments

Hereinafter, a method of forming a semiconductor package according to further embodiments will be described. FIGS. 12 through 15 are sectional views illustrating a method of forming a semiconductor package according to these further embodiments.

Figure 12:
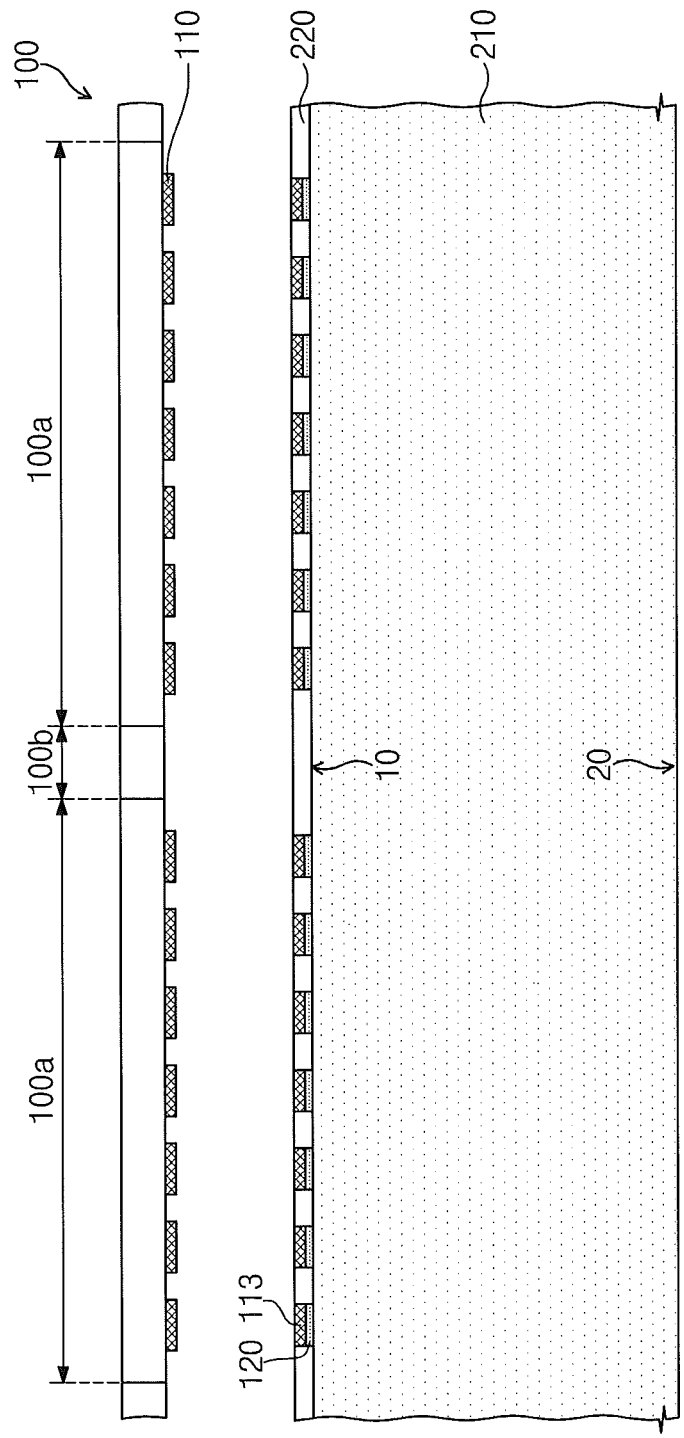
FIGS. 12 through 15 are sectional views illustrating a method of forming a semiconductor package according to other embodiments of the inventive concept.

Referring to FIG. 12, the substrate 210 has the first side 10 and the opposite second side 20. The substrate 210 may include silicon or glass. The mold layer 220 may be formed on the first side 10 of the substrate 210. The mold layer 220 may include the opening 225 exposing the first side 10 of the substrate 210. The opening 225 may be aligned to a through electrode 230 described later with reference to FIG. 15. The mold layer 220 may include an adhesive material. The mold layer 220 may be formed through the same method as the above embodiments.

A wafer 100 including a plurality of semiconductor chips 100a may be provided on the first side 10 of the substrate 210. The wafer 100 may further include a scribe lane 100b between the semiconductor chips 100a as described in the above embodiments. The wafer 100 may include the same material as the above embodiments.

The semiconductor chips 100a may include the conductive pad 110. The conductive pad 110 may be formed through an electroless plating process or an electro plating process. The conductive pad 110 may include metal. For example, the conductive pad 110 may include at least one of Al, Cu, Ni, or Au.

A seed pattern 120 and a bonding pad 113 may be formed in the opening 225 of the mold layer 220. The seed pattern 120 may be formed using the same method and same material as the above embodiments.

The bonding pad 113 may be formed on the seed pattern 120.

The bonding pad 113 may include metal. For example, the bonding pad 113 may include at least one of Al, Cu, Ni, or Au. The bonding pad 113 may be formed through an electro plating process, an electroless plating process, or a metal growth process, which use the seed pattern as a seed.

The wafer 100 may be bonded with the substrate 210 by the molding layer 220. The wafer 100 may be disposed to allow the conductive pad 110 to be adjacent to the mold layer 220. Accordingly, the conductive pad 110 may contact the bonding pad 113. According to some embodiments, when the wafer 100 is bonded with the substrate 210, the conductive pad 110 may contact the bonding pad 113. At this point, since the conductive pad 110 and the bonding pad 113 include metal, electrical characteristics may be improved compared to a case that the conductive pad 110 or the bonding pad 113 contacts a layer (e.g., glass or silicon) including a non-metallic material. According to some embodiments, the conductive pad 110 and the bonding pad 113 may include the same metallic material. In other embodiments, the conductive pad 110 and the bonding pad 113 may include respectively different materials.

Figure 13:
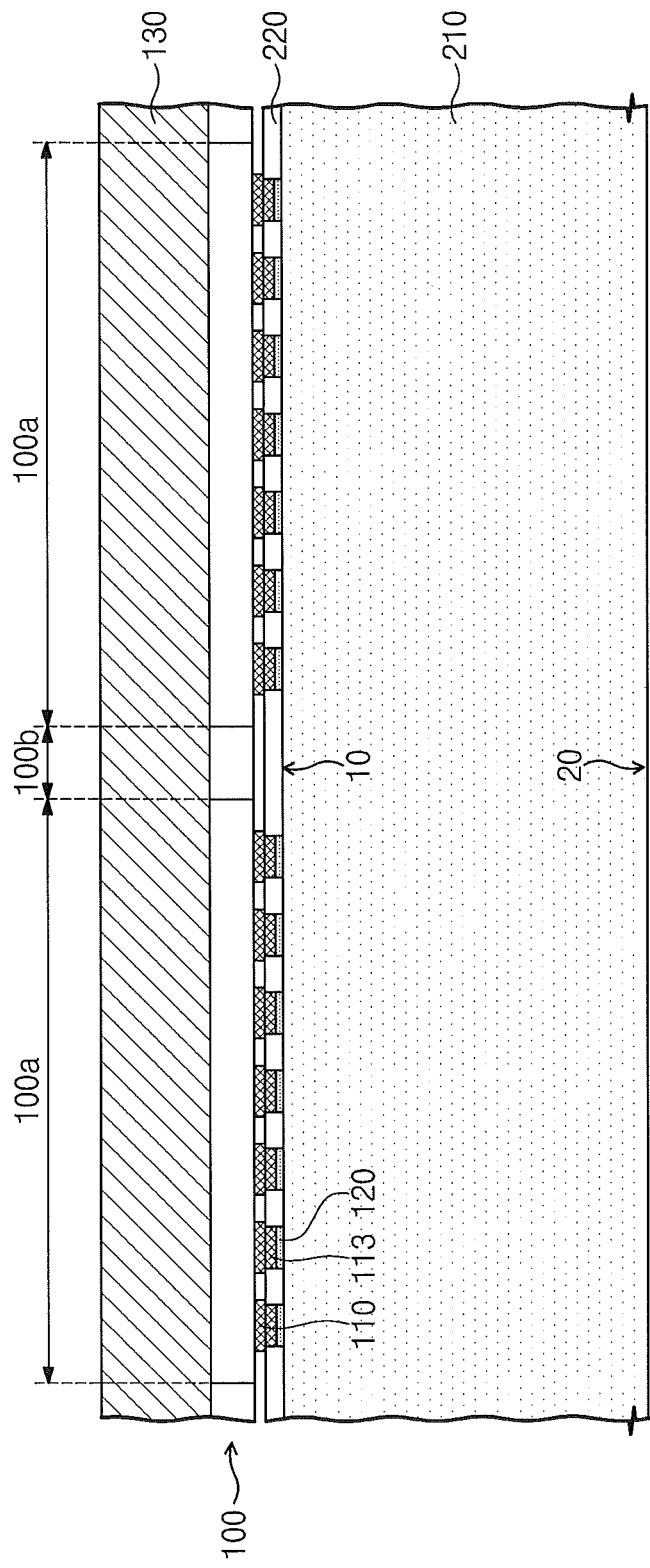

Referring to FIG. 13, a protective layer 130 may be formed on the first side 10 of the substrate 210 to cover the wafer 100. The protective layer 130 may be the same as that of the above embodiments.

A thickness of the substrate 210 may be reduced by etching the second side 20 of the substrate 210. The reducing of the thickness of the substrate 210 may be the same as that of the embodiments described with reference to FIG. 5 to define the etched substrate 210a. According to some embodiments, the reducing of the thickness of the substrate 210 may be omitted. In this case, the thickness of the substrate 210 without etching may be sufficiently thin to directly form a through electrode therein.

Figure 14:
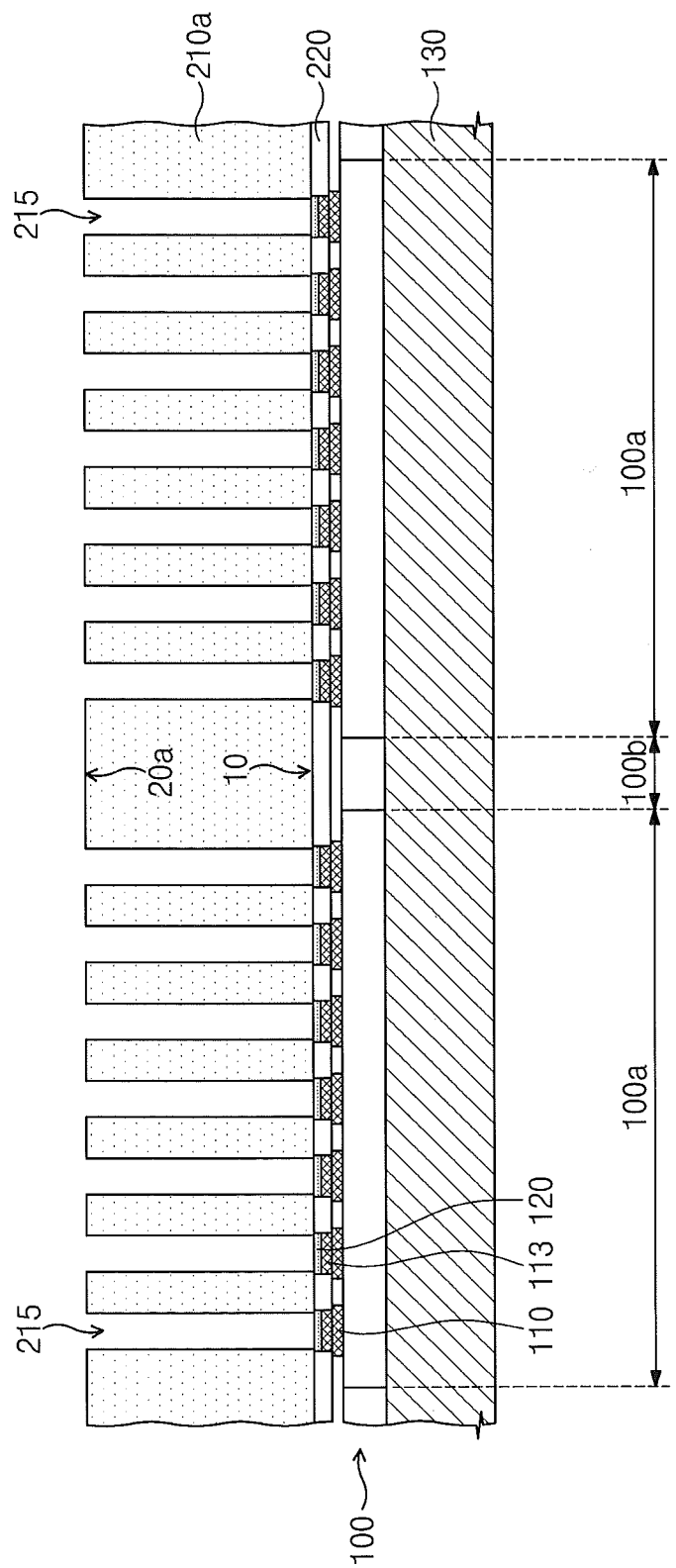

Referring to FIG. 14, the through hole 215 penetrating from the etched second side 20a to the etched substrate 210a may be formed in the etched substrate 210a. A bottom of the through hole 215 may expose the seed pattern 120. The through hole 215 may be formed through the same method as the above embodiments described with reference to FIG. 6.

Figure 15:
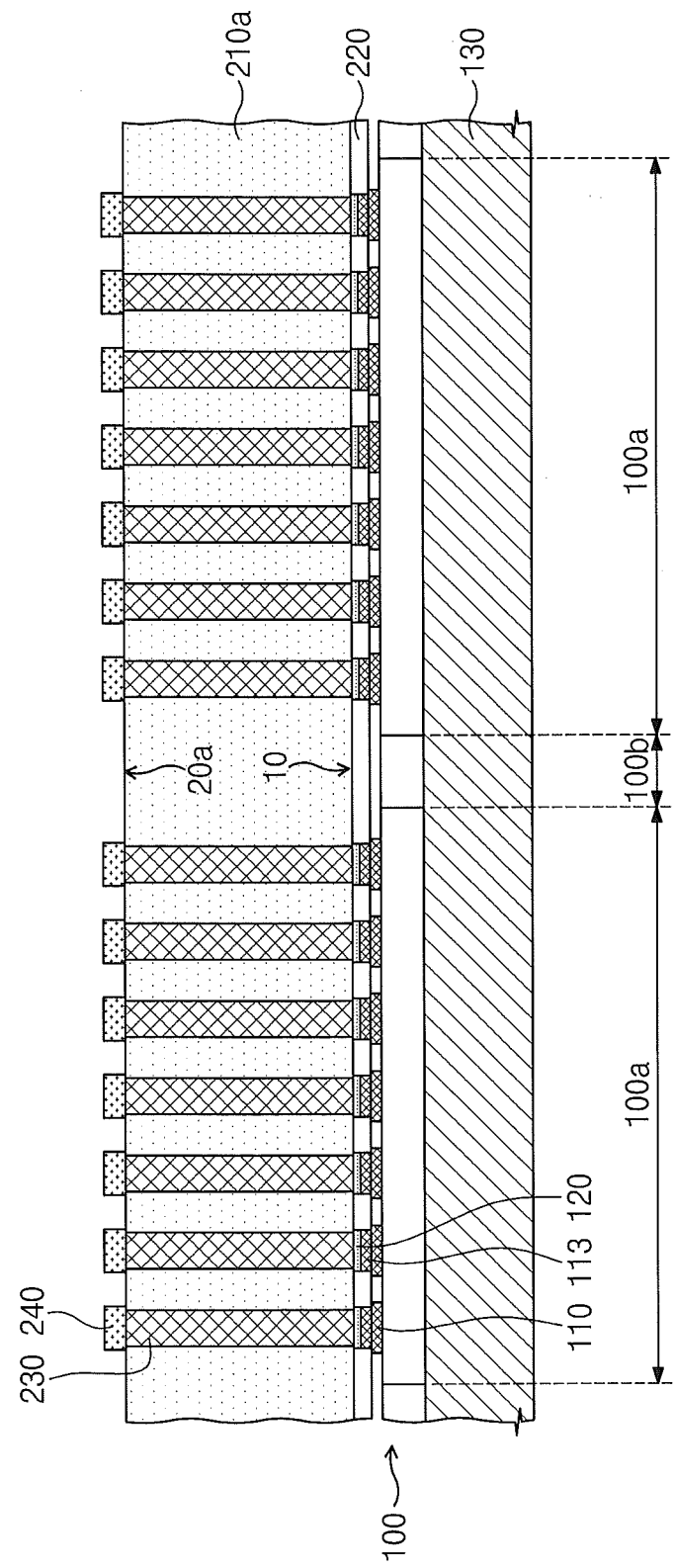

Referring to FIG. 15, the through electrode 230 may be formed in the through hole 215. The through electrode 230 may be formed through the same method and form as the above embodiments described with reference to FIG. 7. According to some embodiments, like the above embodiments, as the through electrode 230 is formed using the exposed seed pattern 120, a process for forming a seed layer in the through hole 215 to form the through electrode 230 may not be additionally performed. Accordingly, manufacturing processes may become simplified so that productivity may be improved and manufacturing cost may be reduced.

In some embodiments where the substrate 210 includes glass, before the forming of the through electrode 230, a spacer may be interposed between the sidewall of the through hole 215 and the through electrode 230. The spacer may be the same as that of the above embodiments.

In other embodiments where the substrate 210 includes glass, the through electrode may be directly formed in the through hole 215. In this case, since the substrate 210 has insulation, adjacent through electrodes may be effectively electrically insulated from each other without the interposer. Accordingly, as a spacer does not need to be formed on the sidewall of the through hole 215 as an interposer, a width of the through hole 215 for forming the through electrode 230 may be reduced, so that a desired process margin may be obtained.

A wiring 240 may be formed on the etched second side 20a of the etched substrate 210a. The wiring 240 may be the same as the above embodiments. A bump may be further formed on the wiring 240. The bump may be same as that of the above embodiments.

The plurality of semiconductor chips 100a may be separated by cutting along the scribe lane 100b through the protective layer 130, and the etched substrate 210a and the wafer 100. A plurality of semiconductor packages according to some embodiments may be formed by the cutting process.

According to some embodiments, after the substrate 210 is bonded with the wafer 100, the through electrode 230 may be formed. If a through electrode is formed first on an interposer substrate and a wafer is bonded to the interposer substrate, due to misalignment between the conductive pad of the wafer and the through electrode, defects may occur. Moreover, in order to form the through electrode, a hole is formed in the interposer substrate and then, a process for forming a seed layer on a bottom of the hole may be additionally performed. However, according to some embodiments, defects due to misalignment between the through electrode and the conductive pad of the wafer may be minimized and manufacturing processes may be simplified so that productivity may be improved.

Figure 16A:
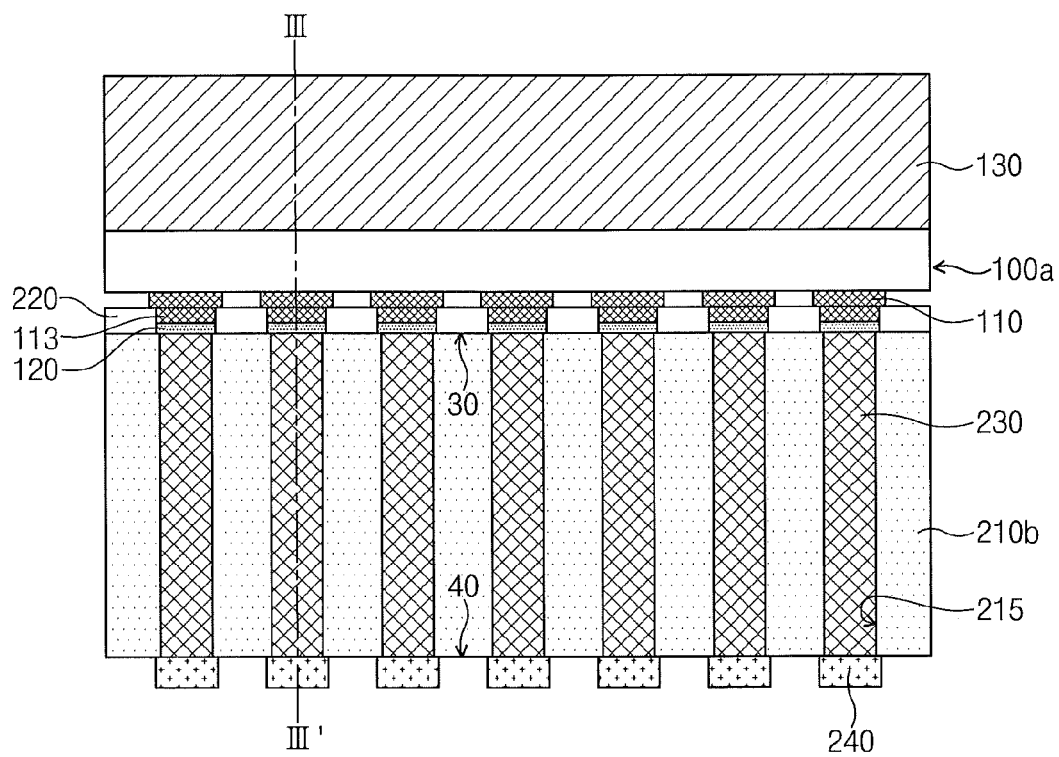
FIGS. 16A and 16B are sectional views illustrating a semiconductor package according to other embodiments of the inventive concept.
Figure 16B:
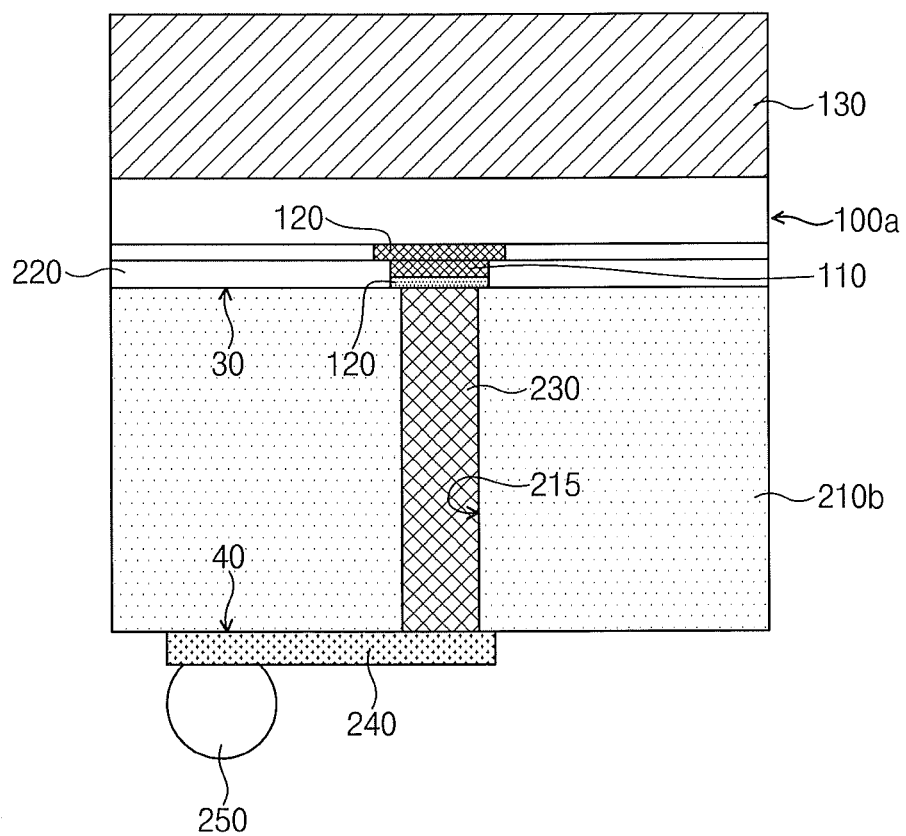

Hereinafter, a semiconductor package according to further embodiments will be described. FIG. 16A is a sectional view illustrating a semiconductor package according to further embodiments. FIG. 16B is a sectional view taken along the line III-III' of FIG. 16A.

Referring to FIG. 16A, a substrate 210b may have a first side 30 and an opposite second side 40. The substrate 210b may include at least one of silicon or glass. According to some embodiments, the substrate 210b may include an interposer. When the substrate 210 includes an interposer, the substrate 210b may be disposed between the semiconductor chip 100a and a circuit substrate in a semiconductor module using a semiconductor package according to some embodiments.

The through electrode 230 penetrating the substrate 210b may be disposed in the substrate 210b. The through electrode 230 may be the same as that of the above embodiments. In some embodiments where substrate 210b is glass, the through electrode 230 may directly contact the sidewall of the through hole 215.

When the substrate 210b is silicon, a spacer may be interposed between the through electrode 230 and the sidewall of the through hole 215. The spacer may be the same as that of the above embodiments. The spacer may limit or even prevent respective adjacent ones of the through electrodes from being electrically connected to each other through the substrate 210b.

The mold layer 220 including the opening 225 may be disposed on the first side 30 of the substrate 210b. The opening 225 may be aligned to the through electrode 230. The mold layer 220 may include an adhesive material.

The semiconductor chip 100a may include the conductive pad 110. The conductive pad 110 may include metal. For example, the conductive pad 110 may include at least one of Al, Cu, Ni, or Au.

Sequentially stacked seed pattern 120 and bonding pad 113 may be disposed in the opening 225 of the molding layer 220. The seed pattern 120, the bonding pad 113, and the through electrode 230 may electrically contact each other. Accordingly, the seed pattern 120 may include a first side contacting the bonding pad 113 and a second side contacting the through electrode 230. The seed pattern 120 may include metal. The seed pattern 120 may include at least one of Ni, Au, or Cu.

The bonding pad 113 may include metal. For example, the conductive pad 110 may include at least one of Al, Cu, Ni, or Au.

The semiconductor chip 100a may be disposed on the mold layer 220. As the conductive pad 110 is disposed adjacent to the mold layer 220, it may electrically contact the bonding pad 113. Accordingly, the through electrode 230, the seed pattern 120, the bonding pad 113, and the conductive pad 110 may be electrically connected to each other.

A protective layer 130a may be dispose on the semiconductor chip 100a to face the substrate 210b. The protective layer 130a may include the same material as that of the above embodiments described with reference to FIG. 11A.

Referring to FIG. 16B, the wiring 240 and the bump 250 may be further disposed on the second side 40 of the substrate 210b. The wiring 240 may electrically contact the through electrode 230. Accordingly, a circuit of the semiconductor chip 100a may be rewired by the wiring 240. The bump 250 is disposed on the wiring 240 so that it may electrically contact the wiring 240. The bump 250 may include a solder ball. The bump 250 may electrically connect a circuit substrate for forming a semiconductor module with a semiconductor package according to some embodiments.

According to some embodiments, as a through electrode in a substrate is formed while a semiconductor chip is bonded with the substrate, manufacturing processes may be simplified compared to a case that a through electrode is formed in the substrate and then is bonded with a semiconductor chip. Therefore, productivity of a semiconductor package may be improved.

Additionally, as the substrate may be formed of glass, an additional process for insulating the substrate from the through electrode is unnecessary. Productivity may be improved and a semiconductor package with improved reliability and electrical characteristics may be formed.

As described above, some embodiments of the present inventive concept provide a method of forming a semiconductor package with improved productivity. Some embodiments of the present inventive concept also provide a semiconductor package with improved electrical characteristic and reliability.

Embodiments of the inventive concept provide methods of forming a semiconductor package, the methods including: preparing a substrate having a first side and a second side facing each other; preparing a wafer having a plurality of semiconductor chips, each of the semiconductor chips having a conductive pad; bonding the first side of the substrate with the wafer, wherein the conductive pad is disposed adjacent to the first side of the substrate and a seed pattern is interposed between the conductive pad and the first side of the substrate; forming a through hole penetrating the substrate from the second side of the substrate to expose the seed pattern; and forming a through electrode in the through hole by using the seed pattern as a seed.

In yet further embodiments, the wafer may include a scribe lane between the plurality of semiconductor chips, and the methods may further include, after the forming of the through electrode, separating the plurality of semiconductor chips by cutting the scribe lane and the substrate.

In other embodiments of the inventive concept, semiconductor packages include: a substrate having a first side and a second side facing each other; a semiconductor chip on the first side of the substrate and including a conductive pad adjacent to the first side of the substrate; a through electrode penetrating the substrate and connected electrically to the conductive pad; and a seed pattern disposed between the conductive pad and the through electrode and having a first side contacting the conductive pad and a second side contacting the through electrode. In even other embodiments, the semiconductor packages may further include: a wiring disposed on the second side of the substrate; and a bump contacting the wiring. In yet other embodiments, the semiconductor packages may further include a protective layer disposed on the first side of the substrate to cover the semiconductor chip.

The foregoing is illustrative of the present invention and is not to be construed as limiting thereof. Although a few embodiments of the present invention have been described, those skilled in the art will readily appreciate that many modifications are possible in the embodiments without materially departing from the novel teachings and advantages of the present invention. Accordingly, all such modifications are intended to be included within the scope of the present invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:
1. A method of forming a semiconductor package, the method comprising:
providing a substrate having a first side and an opposite second side;

providing a wafer having a plurality of semiconductor chips, each of the semiconductor chips having a conductive pad, wherein at least one of the substrate and the wafer includes a seed pattern;

bonding the first side of the substrate to the wafer with the conductive pad positioned adjacent to the first side of the substrate and with the seed pattern positioned between the conductive pad and the first side of the substrate and contacting the first side of the substrate; and then forming a through hole penetrating the substrate from the second side of the substrate to expose the seed pattern; and forming a through electrode in the through hole using the seed pattern as a seed.

2. The method of claim 1, wherein at least one of providing the wafer and providing the substrate includes forming the seed layer.

3. The method of claim 2, wherein providing the wafer includes forming the seed pattern on the conductive pad of the wafer and wherein bonding the first side of the substrate includes contacting the first side of the substrate with the seed pattern of the wafer.

4. The method of claim 3, wherein providing the substrate includes:

forming an adhesive mold layer on the first side of the substrate; and patterning the mold layer to define an opening; and wherein bonding the first side of the substrate includes aligning the wafer with the substrate to position the contact pad and the seed layer in the opening in the mold layer and then bonding the wafer to the first side of the substrate with the adhesive mold layer.

5. The method of claim 2, wherein providing the substrate includes forming the seed pattern on the first side of the substrate and wherein bonding the first side of the substrate includes contacting the conductive pad of the wafer with the seed pattern of the substrate.

6. The method of claim 5, wherein providing the substrate includes:

forming an adhesive mold layer on the first side of the substrate;

patterning the mold layer to define an opening; and forming the seed pattern in the opening in the mold layer; and wherein bonding the first side of the substrate includes aligning the wafer with the substrate to position the contact pad in the opening in the mold layer and then bonding the wafer to the first side of the substrate with the adhesive mold layer.

7. The method of claim 2, wherein providing the substrate includes forming the seed pattern on the first side of the substrate and forming a bonding pad on the seed pattern and wherein bonding the first side of the substrate includes contacting the conductive pad of the wafer with the bonding pad of the substrate.

8. The method of claim 7, wherein providing the substrate includes:

forming an adhesive mold layer on the first side of the substrate;

patterning the mold layer to define an opening;

forming the seed pattern in the opening in the mold layer; and forming the bonding pad on the seed pattern in the opening in the mold layer; and wherein bonding the first side of the substrate includes aligning the wafer with the substrate to position the contact pad in the opening in the mold layer and then bonding the wafer to the first side of the substrate with the adhesive mold layer.

9. The method of claim 2, wherein forming the seed pattern comprise forming the seed pattern using an electroplating process or an electroless plating process.

10. The method of claim 2, wherein forming the through hole is preceded by forming a protective layer on the first side of the substrate that covers the wafer.

11. The method of claim 2, wherein forming the through electrode comprise forming the through electrode using an electroless plating process, an electro plating process, or a metal growth process.

12. The method of claim 8, wherein forming the through electrode comprise forming the through electrode using a metal growth process.

13. The method of claim 2, wherein forming the through electrode is followed by:

forming a wiring on the second side of the substrate that is electrically connected to the through electrode; and forming a bump on the wiring.

14. The method of claim 2, wherein the wafer includes a scribe lane between adjacent ones of the plurality of semiconductor chips and wherein forming the through electrode is followed by separating the plurality of semiconductor chips by cutting the substrate and the wafer along the scribe lane.

15. The method of claim 2, wherein the conductive pad and the seed pattern comprises a plurality of conductive pads and seed patterns associated with each of the plurality of semiconductor chips and wherein bonding the first side of the substrate includes bonding the first side with respective ones of the conductive pads positioned with corresponding ones of the seed patterns positioned between the conductive pads and the first side of the substrate and wherein forming the through hole and forming the through electrode comprises forming a through hole and forming a through electrode associated with each of the conductive pads and the corresponding ones of the seed patterns and wherein the seed patterns comprise at least one of copper (Cu), silver (Ag), or nickel (Ni).

16. The method of claim 2, wherein the substrate comprises glass and wherein forming the through electrode comprises forming the through electrode directly contacting the substrate in the through hole.

* * * * *